(12) United States Patent
Pourquier et al.

(10) Patent No.: US 12,027,643 B2
(45) Date of Patent: Jul. 2, 2024

(54) PROCESS FOR PRODUCING ADJACENT CHIPS COMPRISING LED WIRES AND DEVICE OBTAINED BY THE PROCESS

(71) Applicants: ALEDIA, Grenoble (FR); COMMISSARIAT A L'ENERGIE ATOMIQUE ET AUX ENERGIES ALTERNATIVES, Paris (FR)

(72) Inventors: Eric Pourquier, Grenoble (FR); Hubert Bono, Grenoble (FR)

(73) Assignees: ALEDIA, Grenoble (FR); COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 133 days.

(21) Appl. No.: 17/232,287

(22) Filed: Apr. 16, 2021

(65) Prior Publication Data

US 2021/0234066 A1 Jul. 29, 2021

Related U.S. Application Data

(62) Division of application No. 14/652,435, filed as application No. PCT/EP2013/077745 on Dec. 20, 2013, now Pat. No. 11,063,177.

(Continued)

(30) Foreign Application Priority Data

Dec. 21, 2012 (FR) .................................... 12 62537

(51) Int. Cl.
*H01L 33/08* (2010.01)
*B82Y 10/00* (2011.01)
(Continued)

(52) U.S. Cl.
CPC .............. *H01L 33/06* (2013.01); *B82Y 10/00* (2013.01); *B82Y 40/00* (2013.01);
(Continued)

(58) Field of Classification Search
CPC ....... H01L 33/06; H01L 27/15; H01L 33/007; H01L 33/0095; H01L 33/08; H01L 33/18;
(Continued)

(56) References Cited

U.S. PATENT DOCUMENTS 6,340,822 B1 * 1/2002 Brown ..................... H01L 24/13
257/E23.068
7,906,354 B1 3/2011 Ellinger et al.
(Continued)

FOREIGN PATENT DOCUMENTS

FR 2 949 278 A1 2/2011
JP 2009-010012 A 1/2009
(Continued)

*Primary Examiner* — David Chen
(74) *Attorney, Agent, or Firm* — BakerHostetler

(57) ABSTRACT

A process for producing at least two adjacent regions, each comprising an array of light-emitting wires connected together in a given region by a transparent conductive layer, comprises: producing, on a substrate, a plurality of individual zones for growing wires extending over an area greater than the cumulative area of the two chips; growing wires in the individual growth zones; removing wires from at least one zone forming an initial free area to define the arrays of wires, the initial free area comprising individual growth zones level with the removed wires; and depositing a transparent conductive layer on each array of wires to electrically connect the wires of a given array of wires, each conductive layer being separated from the conductive layer of the neighbouring region by a free area. A device obtained using the process of the invention is also provided.

9 Claims, 11 Drawing Sheets

Related U.S. Application Data

(60) Provisional application No. 61/761,027, filed on Feb. 5, 2013.

(51) Int. Cl.
| | |
|---|---|
| *B82Y 40/00* | (2011.01) |
| *H01L 21/02* | (2006.01) |
| *H01L 27/15* | (2006.01) |
| *H01L 29/06* | (2006.01) |
| *H01L 29/12* | (2006.01) |
| *H01L 29/66* | (2006.01) |
| *H01L 33/00* | (2010.01) |
| *H01L 33/06* | (2010.01) |
| *H01L 33/16* | (2010.01) |
| *H01L 33/18* | (2010.01) |
| *H01L 33/24* | (2010.01) |
| *H01L 33/42* | (2010.01) |
| *H01L 33/48* | (2010.01) |
| *H10B 69/00* | (2023.01) |
| *H01L 33/02* | (2010.01) |

(52) U.S. Cl.
CPC ........ *H01L 21/02603* (2013.01); *H01L 27/15* (2013.01); *H01L 29/0676* (2013.01); *H01L 29/068* (2013.01); *H01L 29/125* (2013.01); *H01L 29/127* (2013.01); *H01L 29/6609* (2013.01); *H01L 29/66469* (2013.01); *H01L 33/0008* (2013.01); *H01L 33/0062* (2013.01); *H01L 33/007* (2013.01); *H01L 33/0095* (2013.01); *H01L 33/08* (2013.01); *H01L 33/16* (2013.01); *H01L 33/18* (2013.01); *H01L 33/24* (2013.01); *H01L 33/42* (2013.01); *H01L 33/48* (2013.01); *H10B 69/00* (2023.02); *H01L 33/02* (2013.01); *H01L 2924/0002* (2013.01); *H01L 2933/0016* (2013.01)

(58) Field of Classification Search
CPC .. H01L 33/24; H01L 33/42; H01L 2933/0016
USPC ................................. 438/26, 27, 29, 34, 35
See application file for complete search history.

(56) References Cited

U.S. PATENT DOCUMENTS

| | | |
|---|---|---|
| 2006/0060826 A1 | 3/2006 | Atanackovic |
| 2007/0041214 A1* | 2/2007 | Ha ...................... H01L 33/0093 362/612 |
| 2008/0210956 A1 | 9/2008 | Kim |
| 2009/0035513 A1 | 2/2009 | Bortner et al. |
| 2011/0089401 A1* | 4/2011 | Hiraiwa ................ H01L 33/405 257/E33.072 |
| 2011/0253982 A1 | 10/2011 | Wang et al. |
| 2011/0309382 A1* | 12/2011 | Lowgren ................. H01L 33/08 257/E33.072 |
| 2012/0001303 A1 | 1/2012 | Huang et al. |
| 2012/0164767 A1 | 6/2012 | Gasse et al. |
| 2012/0205613 A1* | 8/2012 | Mi ......................... H01L 29/775 257/E21.09 |
| 2012/0205614 A1 | 8/2012 | Templier et al. |
| 2012/0223289 A1 | 9/2012 | Gwo et al. |
| 2014/0117401 A1* | 5/2014 | Herner ................... H01L 33/62 438/42 |

FOREIGN PATENT DOCUMENTS

| | | |
|---|---|---|
| JP | 2009-094228 A | 4/2009 |
| JP | 2011-036995 A | 2/2011 |
| JP | 2011-527519 A | 10/2011 |
| WO | 2007/081381 A2 | 7/2007 |
| WO | 2009/009612 A2 | 1/2009 |
| WO | 2010044129 A1 | 4/2010 |
| WO | 2011/020959 A | 2/2011 |
| WO | 2011/048318 A1 | 4/2011 |

* cited by examiner

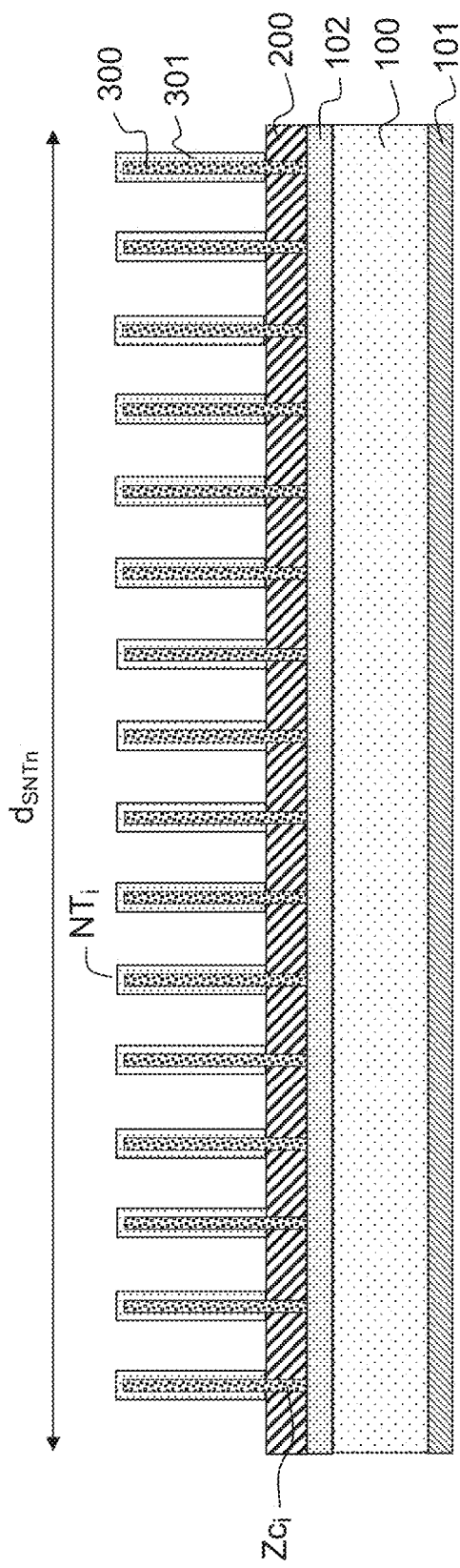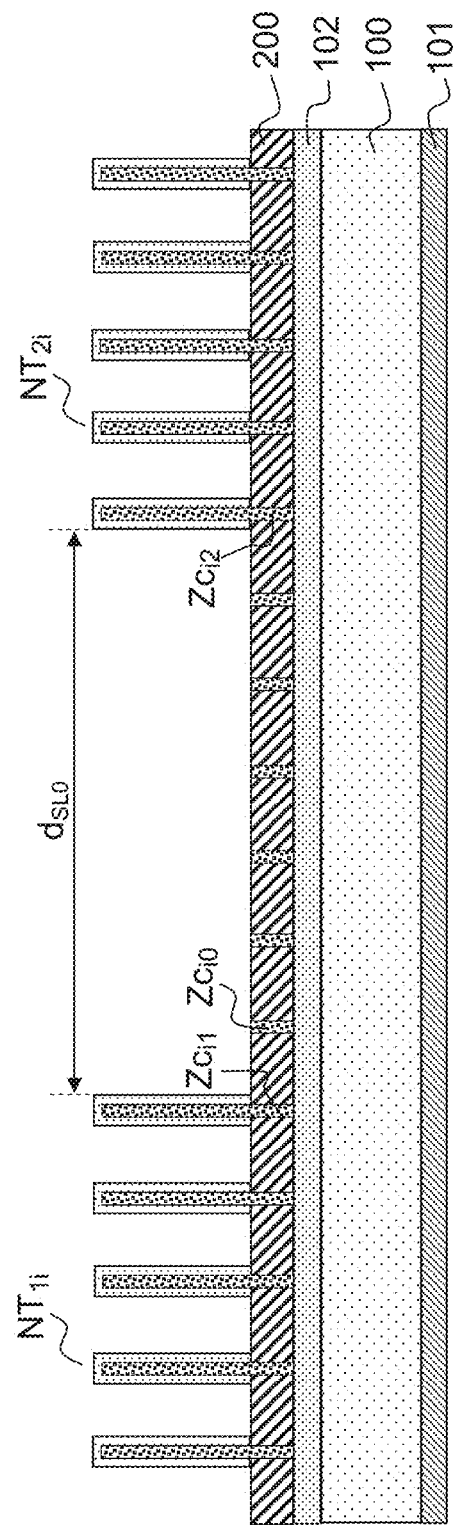

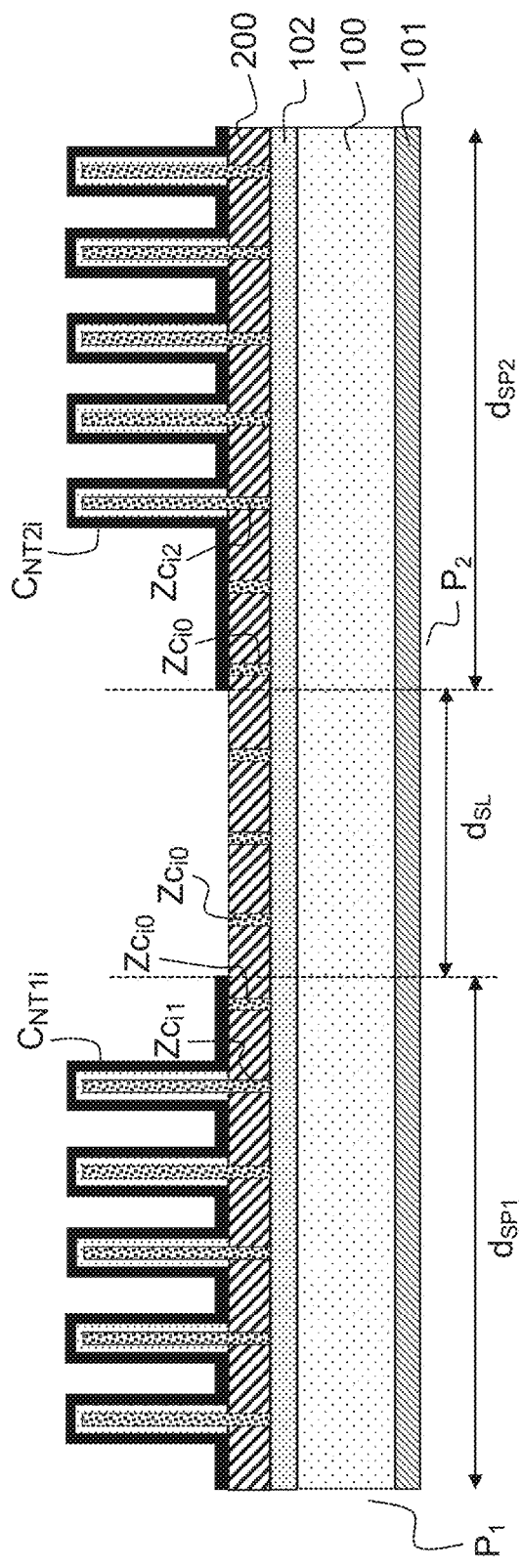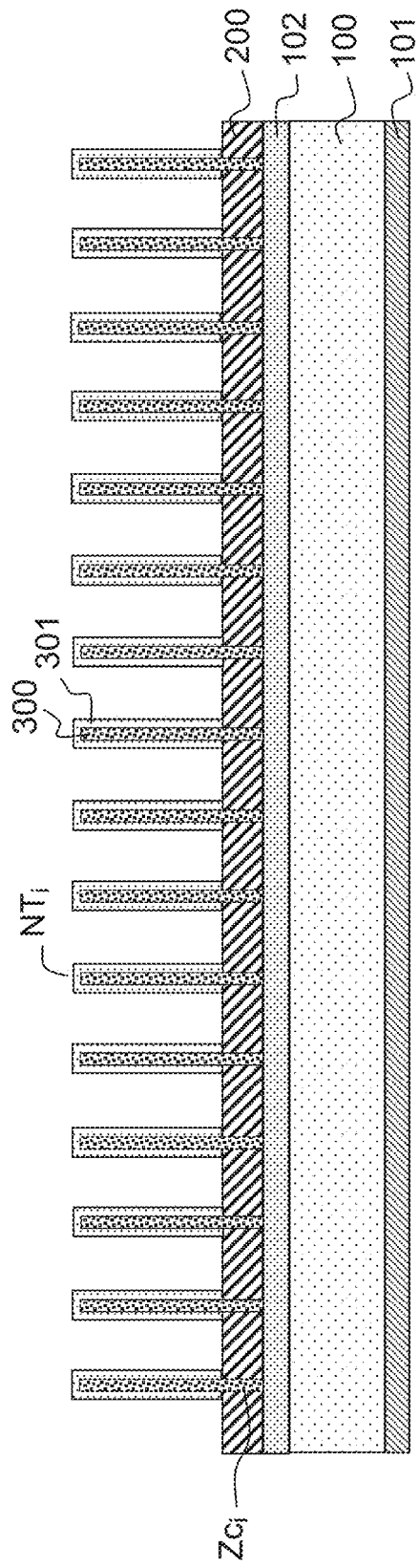

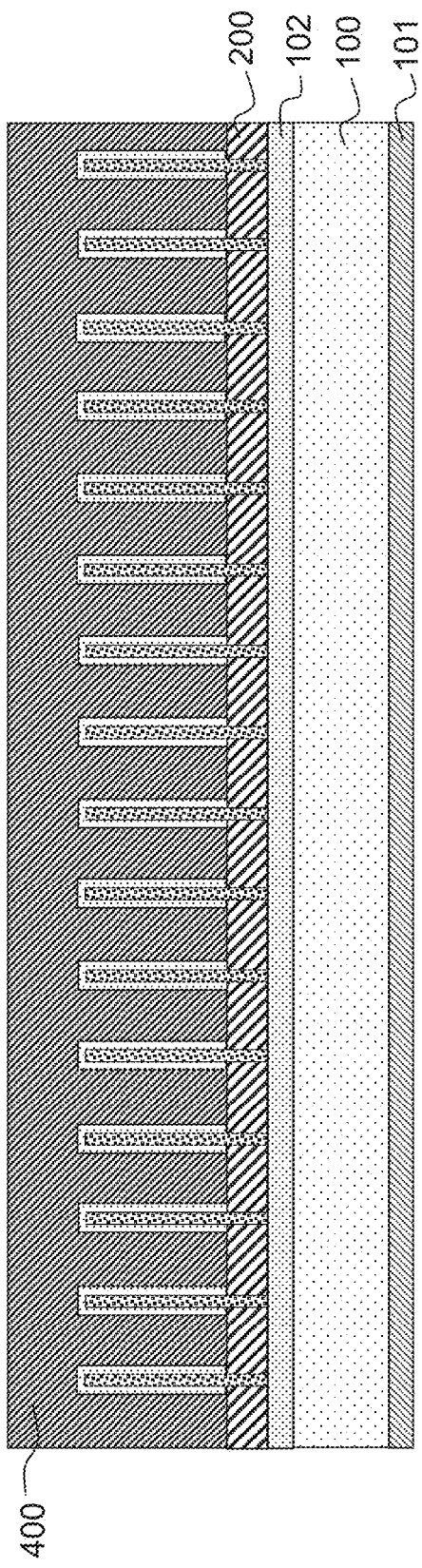
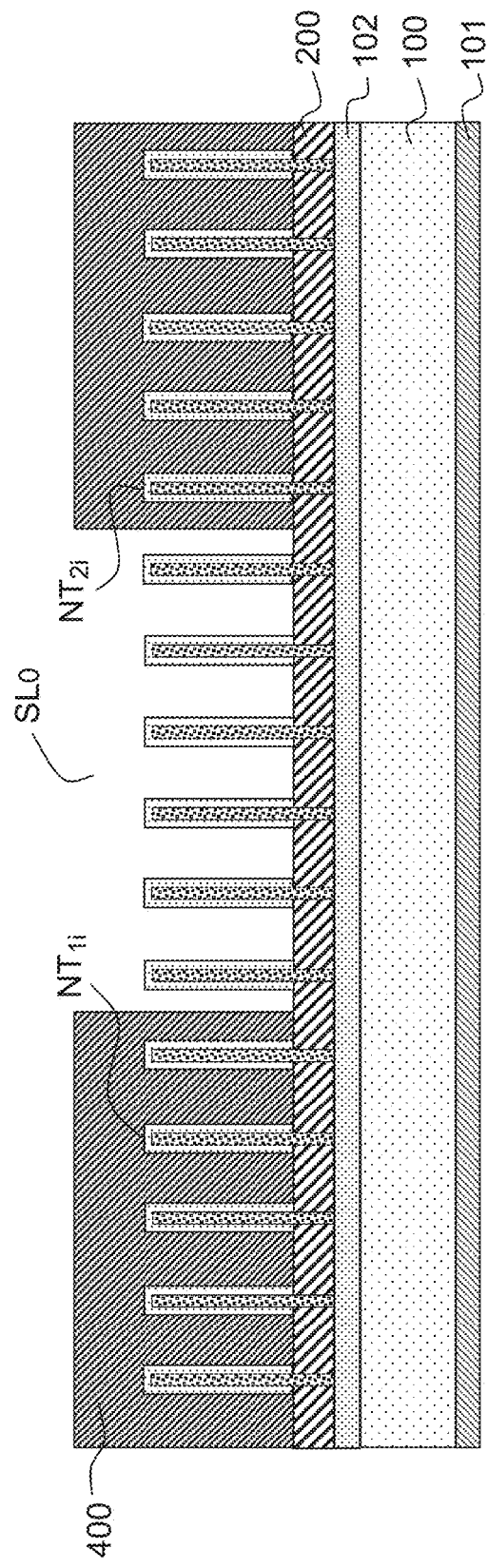

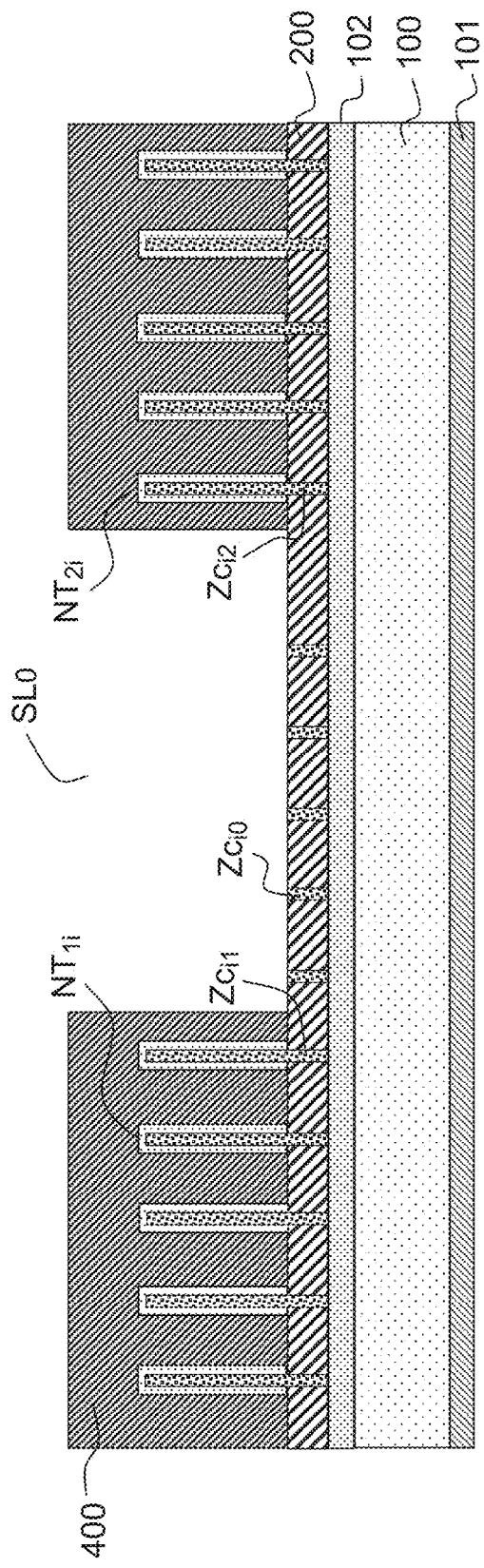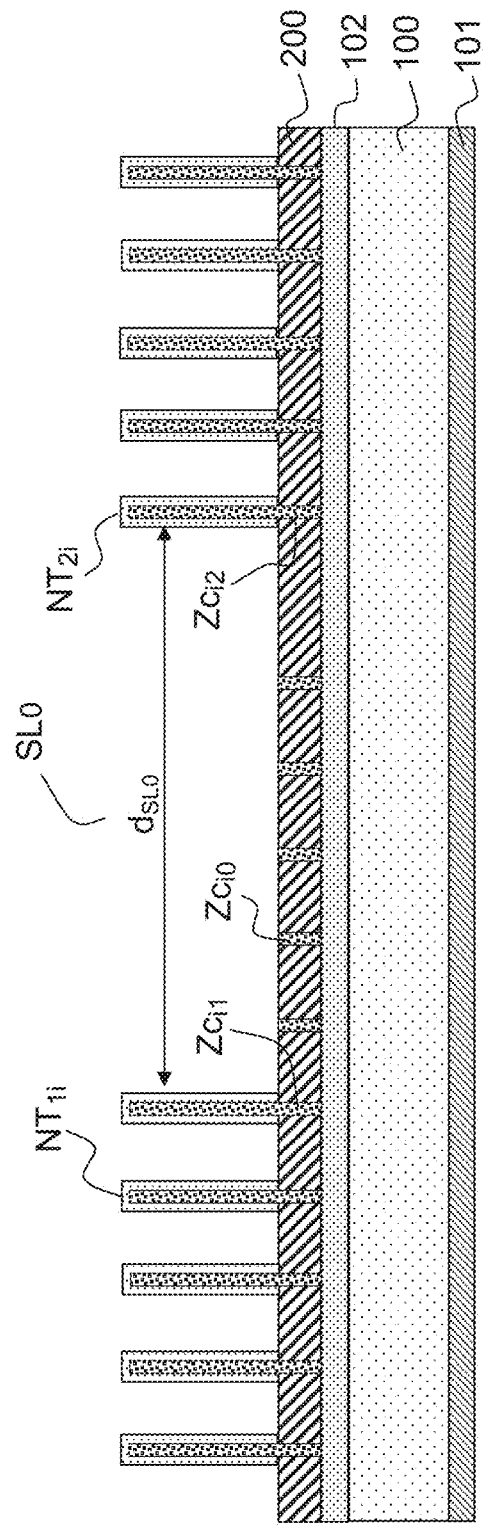

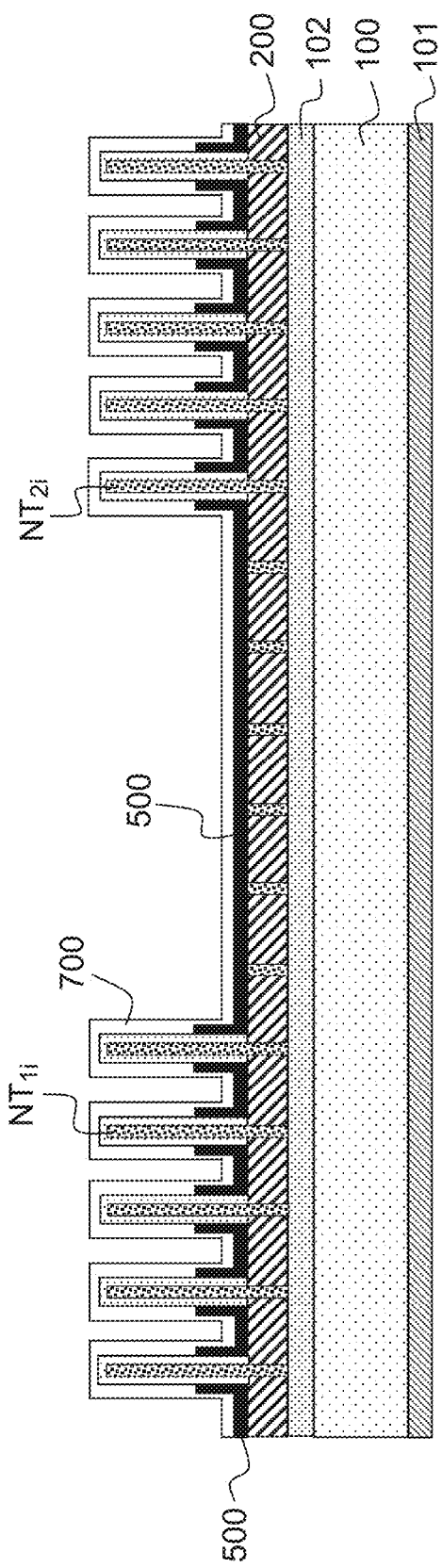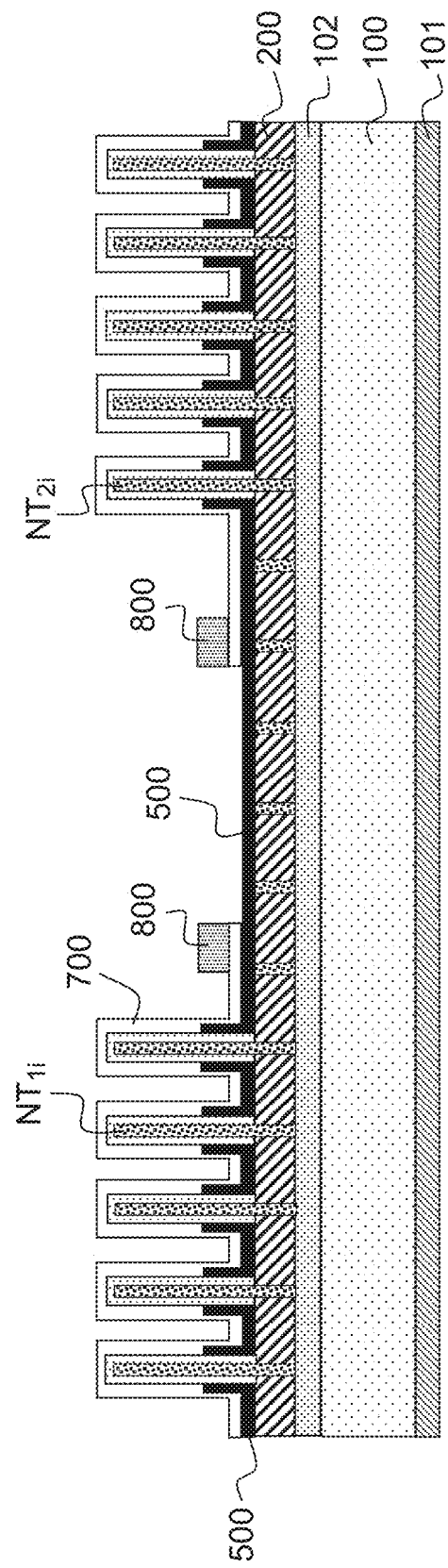

PROCESS FOR PRODUCING ADJACENT CHIPS COMPRISING LED WIRES AND DEVICE OBTAINED BY THE PROCESS

CROSS-REFERENCE TO RELATED APPLICATIONS

This application is a divisional of U.S. patent application Ser. No. 14/652,435, filed Jun. 15, 2015, which is a National Stage of International patent application PCT/EP2013/077745, filed on Dec. 20, 2013, which claims priority to foreign French patent application No. FR 1262537, filed on Dec. 21, 2012, and to U.S. provisional patent application no. 61/761,027, filed Feb. 5, 2013, the disclosures of which are incorporated by reference in their entirety.

FIELD OF THE INVENTION

The field of the invention is that of components based on small wires (possibly being smaller than typically one micron in size) produced on the wafer scale by localized growth on a substrate possibly made of silicon, GaN or sapphire, inter alia.

More precisely, the field of the invention may relate to components based on light-emitting wires. The wires form light-emitting diodes and are called LED (light-emitting diode) wires below.

BACKGROUND

In the last few years, visible light-emitting diodes (LEDs) based on vertical InGaN/GaN wires containing a p-n junction and connected together in parallel, have been produced.

By virtue of their potential intrinsic properties (good crystal quality, relaxation of stresses at the free vertical surfaces, good light extraction efficiency for the light via waveguiding, etc.) these wires are considered to be very promising candidates for addressing the difficulties currently encountered with conventional GaN LEDs fabricated with a (2D) planar structure.

Two LED wire approaches, based on different growth techniques, have been developed by the Grenoble CEA.

The first approach consists in growing GaN wires containing InGaN quantum wells in an axial configuration epitaxially by molecular beam epitaxy (MBE). Devices fabricated from these wires have produced encouraging results in the green spectral domain. Processed chips with an area of 1 mm$^2$ are able to emit about 10 µW at 550 nm for a direct operating current of 100 mA.

FIG. 1 illustrates such a configuration showing wires $NT_i$ on the surface of a substrate 11, typically made of silicon, making contact with an n-type lower contact 10, the p-type upper contact being provided by a transparent layer 12 which is connected to a thick p-type connector 13. The axially structured wires $NT_i$ comprise an n-doped zone possibly and typically made of n-doped GaN, an active zone ZA made of InGaN or possessing a quantum-well structure, and a p-doped zone possibly made of p-doped GaN.

With the MBE growth technique, certain nonuniformities appear because of random nucleation mechanisms, but typically an optical power of 50 nW has been obtained for a single wire emitting at 550 nm, i.e. 5 W/mm$^2$ for one hundred emitting wires/mm$^2$.

More recently, the MOCVD (metal-organic chemical vapour deposition) growth technique has allowed InGaN/GaN wires containing a radial LED structure (core/shell configuration) to be produced.

FIG. 2 illustrates this type of configuration, in which wires $NT_i$ are produced on the surface of a substrate 11 covered with a nucleation layer 12, a lower contact layer 10 also being provided. Localized epitaxy is ensured through a mask 20. The wires have a core/shell structure. The core 30 may comprise an n-doped GaN material, typically with a doping level of 10$^{19}$ cm$^{-3}$, a quantum-well structure with an alternation of layers, possibly made of undoped GaN and InGaN, respectively, and lastly a shell 31 possibly consisting of a layer of p-doped GaN typically with a doping level of 10$^{19}$ cm$^{-3}$.

A dielectric layer 40 isolates the upper and lower contacts.

The upper contact is provided by a conductive upper layer 50 that is transparent at the emission wavelength of the photoconductive structure. A metal contact layer 60 is also provided.

In this approach, since the LED structure has a core/shell configuration, the area of the active zone is larger than for the 2D LED wire approach.

This property has two advantageous effects: emitting area is increased and current density in the active zone is decreased. Complete LED structures have been produced on a silicon substrate and light emission in the blue spectral domain (450 nm) has been obtained for an array of wires integrated after technological processing.

Nevertheless, the Applicant has observed that epitaxial processes such as the MOCVD process generate, above all due to consumption of gaseous species, edge effects, which are detrimental to obtaining uniform components, and discontinuities in wire growth zones, more precisely the area growth rate varies over the wafer.

Indeed, especially in the case of LEDs, wires fabricated by epitaxy, for example of GaN, on growth patterns may be produced by standard microelectronic techniques.

These patterns are arranged on the substrate in the form of regular patterns in compact zones that are square, round, etc. and that define the active area of the LED. These zones have dimensions, 1 mm by 1 mm for example, that are set by the requirements of the end user of the product. Each growth zone is separated from its neighbour by a space the size of which is adjusted at least to allow metal connections for supplying the LEDs to pass and the substrates to be cut by sawing.

These spaces between growth zones, in which no epitaxy is desired, cause a number of defects to appear, namely:

nonuniformities in height and shape, in the networks of wires, related to the discontinuities between the growth zones;

unplanned growth of nanocrystals, for example of GaN, which are killer defects for circuits at the back end of line; and deposition of parasitic InGaN which carpets the surfaces of wafers of conductive materials.

FIG. 3 illustrates a view of an array of wires and a set of defects appearing in zones of non-growth, and this micrograph, which was taken with a scanning electron microscope, shows parasitic growths $Cr_{pa}$ and residual growth deposits $R_{cr}$.

SUMMARY OF THE INVENTION

For this reason, in order to overcome the aforementioned drawbacks, the Applicant has devised a process for producing chips comprising LED wires in which two adjacent chips are no longer separated by nonuniformities such as those described above. To do this, the production process of the present invention comprises, in succession, a generalized operation of growing LED wires on a substrate, then selective removal of wires in certain regions of said substrate so as to define individual chips comprising uniform LED wires.

More precisely, one subject of the present invention is a process for producing at least two adjacent chips each comprising an array of light-emitting wires connected together in a given chip by a transparent conductive layer, characterized in that it comprises the following steps:

producing, on a substrate, a plurality of individual zones for growing wires extending over an area greater than the cumulative area of said two chips;

growing wires in the individual growth zones;

removing wires from at least one zone forming an initial free area so as to define said arrays of wires, said initial free area comprising individual growth zones level with the removed wires, which zones are called imprints; and depositing a transparent conductive layer on each array of wires so as to electrically connect the wires of a given array of wires, each conductive layer being separated from the conductive layer of the neighbouring chip by a free area.

Preferably, the individual wire growth zones are apertures defined in a mask located on the surface of said substrate.

As a variant, the individual growth zones are nucleation pads. In this case, the substrate area located between the pads is advantageously made dielectric using an oxidation or nitridation step.

Thus, according to the process of the invention, at least two adjacent chips are produced, each chip comprising an array of LED wires defining what is called an active zone, and a transparent electrode layer some of which, called the projecting part, rests on the base of the substrate and is intended to receive a supply pad.

Thus, two adjacent chips are separated by said free area formed by local removal of LED wires.

The term "chip" is understood to mean an array of wires electrically connected to a given transparent electrically conductive layer. The conductive layer also extends over the substrate, at least over part of the border of the array of wires.

The term "imprints" is understood to mean the individual wire growth zones the corresponding wires of which are removed during the wire removal step. The imprints are therefore located in the initial free area. Some of the imprints may be covered by one of the transparent conductive layers. In the case where the wires are periodically distributed, the pitch of the imprints is equal to the pitch of the wires.

The expression "initial free area" is understood to mean the zone located between the arrays of wires such as defined after the wire removal step.

The expression "free area" is understood to mean the zone located between the chips, more precisely between the conductive layers of the corresponding arrays of wires.

The transparent layers may not extend into the initial free area, in which case the free area substantially corresponds to the initial free area and is substantially the same size.

As a variant, at least one of said conductive layers, even both conductive layers, extend into the initial free area (therefore over the substrate bordering the arrays of wires). In this case, the free area is smaller in size than the initial free area.

When a layer extends over the substrate, it need not make direct contact with the substrate. Thus, at least one intermediate element or layer may be present between said layer and the substrate. Thus, when the transparent conductive layer extends into the initial free area, it extends over the substrate and at least one imprint is located between said layer and the substrate.

Some of imprints may be located under the transparent conductive layers connecting the wires of each of said chips, some of the imprints remaining exposed.

According to one variant of the invention, the substrate comprises a nucleation layer on which said mask is located.

According to one variant of the invention, the process comprises producing electrical pads making it possible to connect said chips, said pads being placed on said corresponding conductive layers.

According to one variant of the invention, the wire removal comprises the following steps:

producing a protective mask containing apertures level with an array of wires located on an initial free area of the substrate, said mask encapsulating at least a first array of wires and a second array of wires separated by said initial free area; and removing the wires in said initial free area.

According to one variant of the invention, the wires are removed by a direct etching operation through said protective mask.

According to one variant of the invention, the wires are removed by a direct chemical etching operation through said protective mask.

According to one variant of the invention, the wires are removed by a direct dry etching operation through said protective mask, with an RIE or ICP plasma.

According to one variant of the invention, the wires are removed by a mechanical action causing said wires to break.

According to one variant of the invention, the mechanical action is delivered by ultrasound According to one variant of the invention, the mechanical action is realized by a high-pressure jet of fluid.

According to one variant of the invention, the mechanical action is realized in the presence of a solid tool.

According to one variant of the invention, if the wires are grown from a nucleation layer, the wire removal step is carried out by attacking said nucleation layer chemically.

Another subject of the invention is a light-emitting device comprising at least two chips arranged on a substrate, each chip being formed from an array of light-emitting wires connected together by a dedicated transparent conductive layer called the transparent chip electrode, and each wire being arranged on the substrate in an individual growth zone, characterized in that:

said two chips are separated from each other by a free area, said free area containing a plurality of individual growth zones exempt from LED wires, which zones are called imprints, the transparent chip electrode being absent from said free area; and said device comprises supply pads on said transparent electrodes.

According to one variant, the individual growth zones are apertures defined in a mask located on the surface of said substrate.

According to one variant, the individual growth zones are nucleation pads on the surface of said substrate.

According to one variant, at least one of said transparent electrodes also covers some of the individual growth zones exempt from LED wires, which zones are called imprints.

According to one variant of the invention, the width of said free area between two adjacent chips is comprised between 10 µm and 200 µm.

According to one variant of the invention, the wires and the individual growth zones are periodically distributed.

According to one variant of the invention, the period of the wires and that of the individual growth zones is comprised between 1 µm and 10 µm.

According to one variant of the invention, the width of the area of a transparent electrode covering individual growth zones exempt from wires is comprised between a few microns and a few hundred microns.

According to one variant of the invention, a substrate is made of silicon.

According to one variant of the invention, the mask is a hard mask possibly made of SiN or $SiO_2$.

According to one variant of the invention, the nucleation pads are made of metal, possibly being made of TiN.

According to one variant of the invention, the wires are made of III-V material(s) or of alloys of III-V material(s).

According to one variant of the invention, the transparent conductive layer is made of indium tin oxide (ITO).

BRIEF DESCRIPTION OF THE DRAWINGS

The invention will be better understood and other advantages will become apparent on reading the following description, which is given by way of nonlimiting example, and by virtue of the appended figures, in which:

FIGS. 6a, 6b and 6c illustrate the various steps of the process for producing adjacent chips according to the invention in the case where a growth mask deposited on a nucleation layer is used; and FIGS. 7a to 7j illustrate all the steps of an example process for producing two adjacent chips of LED wires according to the invention, and comprising a mechanical operation for removing a subset of wires.

DETAILED DESCRIPTION

Generally, it is proposed in the present invention to provide a device comprising a set of chips each of which comprises an array of LED wires and which can be produced under uniform growth conditions.

To do this, the process of the invention comprises a first step of producing individual LED-wire growth zones over an extensive area of a substrate, then the generalized growth of LED wires, followed by localized removal of a subset of LED wires.

The individual wire growth zones may be produced using various processes known in the art.

Figure 4A:
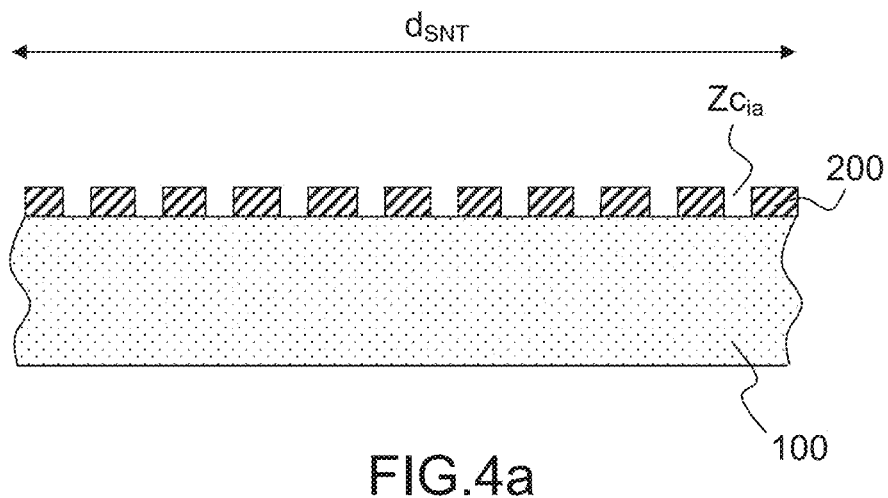
FIGS. 4a and 4b illustrate a first example of individual growth zones produced in a growth mask and the growth of wires over a complete area.
Figure 4B:
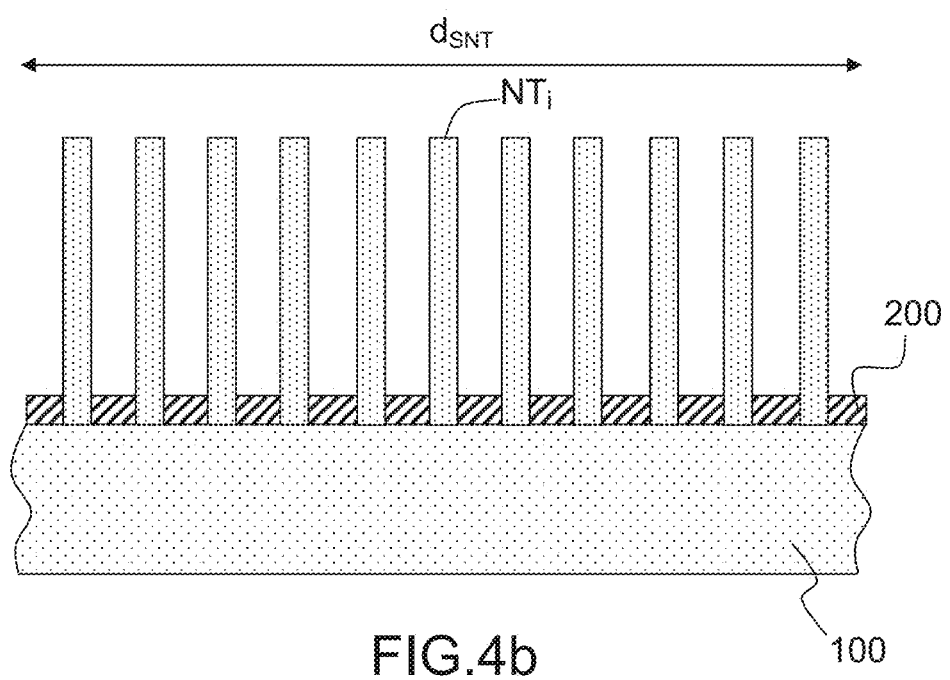

FIG. 4a shows a first variant in which a growth mask 200, comprising apertures corresponding to said individual growth zones $zc_{ia}$, is produced on a substrate 100 in a surface zone of width $d_{SNT}$. In this way, it is, as is known, possible to grow locally LED wires $NT_i$ from these individual growth zones as illustrated in FIG. 4b, the entire surface SNT of the substrate thus being covered with an array of wires $NT_i$.

Figure 5A:
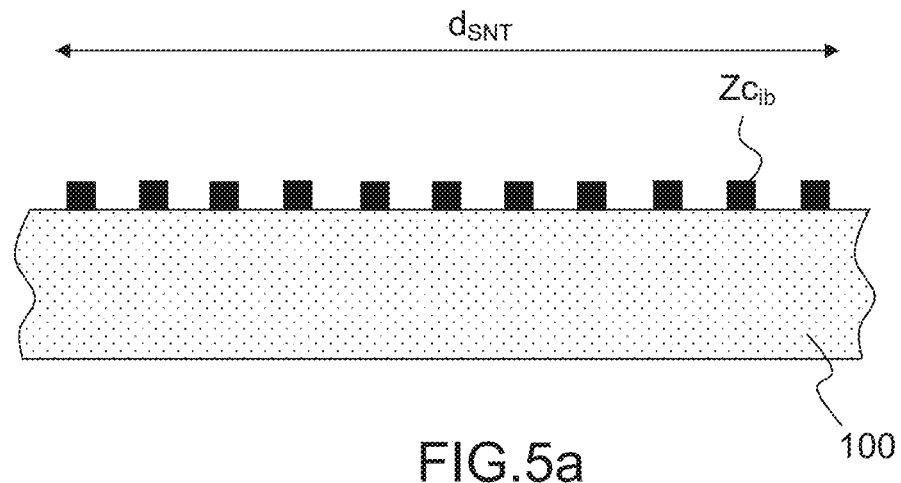
FIGS. 5a and 5b illustrate a second example of individual growth zones produced from nucleation pads and the growth of wires on said pads.
Figure 5B:
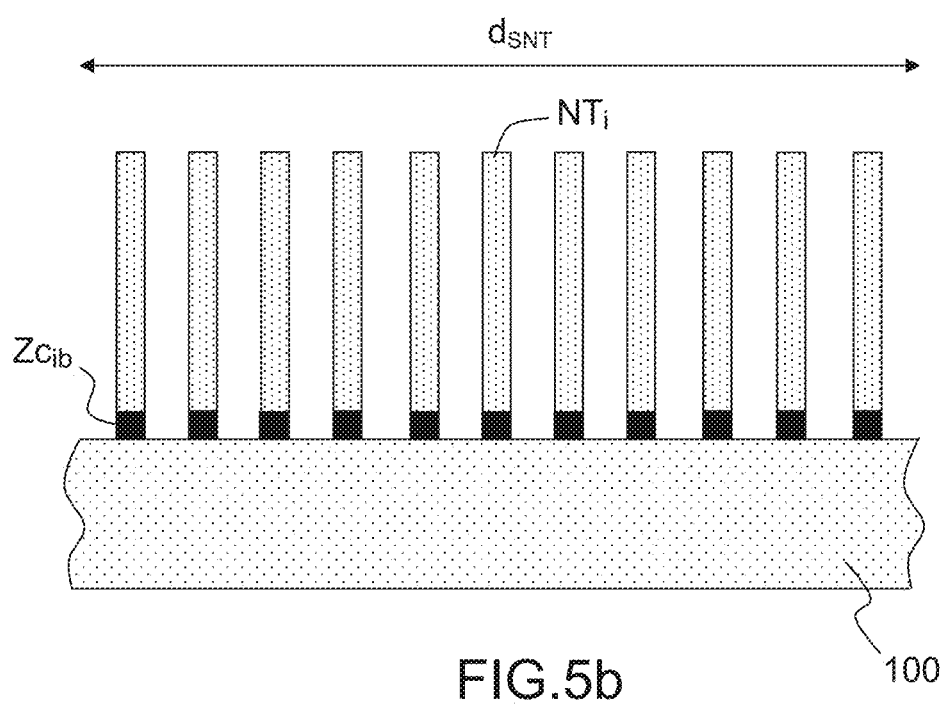

According to another variant of the invention, the individual growth zones may be produced from nucleation pads $zc_{ib}$, fabricated on the surface of the substrate 100, as shown in FIG. 5a. FIG. 5b illustrates growth of the wires $NT_i$ from these nucleation pads $zc_{ib}$, this growth occurring over the entire surface SNT of the substrate. The area of the substrate 100 located between the nucleation pads $zc_{ib}$ is advantageously made dielectric by oxidation or nitridation, as described in patent application US 2012/0001303, so as to prevent wires from growing on the surface of the substrate.

According to the process of the present invention, individual LED chips are defined subsequently.

For this purpose, FIGS. 6a, 6b and 6c illustrate all of the steps for the case of individual growth zones $z_{ci}$ produced through a mask 200 deposited on the surface of a nucleation layer 102 on the surface of a substrate 100 comprising a contact layer 101 on its back side. The wires shown are typically wires comprising a wire core 300 and a shell 301. The wires $NT_i$ are thus grown over all of the surface SNT, as shown in FIG. 6a.

Next, wires are locally and selectively removed at least from between two arrays of wires $NT_{1i}$ and $NT_{2i}$, leaving an initial free area $SL_0$ of width $d_{SL0}$, as illustrated in FIG. 6b. The wires $NT_{1i}$ are located on the surface of growth zones $zc_{i1}$, the wires $NT_{2i}$ are located on the surface of growth zones $zc_{i2}$, and the growth zones exempt from wires are imprints $zc_{i0}$.

Next, a dedicated transparent electrode is produced on each array of LED wires, so as to connect said LED wires together within a given LED chip. As shown in FIG. 6c, an electrode layer $C_{NT1i}$ connects the array of wires $NT_{1i}$ and an electrode layer $C_{NT2i}$ connects the array of wires $NT_{2i}$. The two electrode layers are separated from each other by a free area SL that is smaller than the initial free area SL0 so as to make space to position contact pads (not shown), i.e.:

$$d_{SL} < d_{SL0}.$$

Thus, FIG. 6c shows the production of two adjacent LED chips that are separate from each other:
- a first chip P1 extending over an area of illustrated width $d_{SP1}$ comprising an array of LED wires $NT_{1i}$ covered by a common electrode layer $C_{NT1i}$, and
- a second chip P2 extending over an area of illustrated width $d_{SP2}$ comprising an array of LED wires $NT_{2i}$ covered by a common electrode layer $C_{NT2i}$; where
- each chip comprises individual growth zones with LED wires and growth zones $zc_{i0}$ exempt from LED wires that then correspond to imprints left after removal of LED wires from this initial free area.

Typically, the width da of the free area between two adjacent chips may be comprised between 10 and 200 µm.

The width of the wireless area, i.e. the initial free area, corresponds to the sum of the following widths, the minimum size of which may be about:
- 5 µm for the transparent conductive electrode layer $C_{NT1i}$ projecting over the substrate for the chip P1;
- 10 µm width of free area; and
- 5 µm for the transparent conductive electrode layer $C_{NT2i}$ projecting over the substrate for the chip P2.

Typically, the width of the part of the transparent electrode layer that extends over the growth zones $zc_{io}$ may be comprised between 5 µm and 50 µm around the corresponding array of wires. The width of the part of the same transparent electrode layer dedicated to connection to the metal pad may be comprised between 50 μm and 200 μm.

The periodicity of the wires and therefore of the individual growth zones may be comprised between 1 μm and 10 μm.

Various means may be used in the present invention to remove a localized array of wires.

Notably, this removal may be carried out with means commonly used in microelectronics after zones in which it is desired to preserve the wires have been protected using a hard mask or a resist mask depending on the processes chosen.

First Means for Removing an Array of Wires Using a Chemical Etching Process:

After an array of wires has been coated in a protective mask in order to be preserved, a direct etching operation can be carried out for example using a hot potassium hydroxide KOH solution, in this case a mask resistant to this solution, and therefore a hard mask, possibly made of $SiO_2$ or SiN, inter alia, is chosen.

Second Means for Removing an Array of Wires Using a Dry Etching Process:

After an array of wires has been coated in a protective mask, possibly made of a resist, in order to be preserved, a dry etching operation can be carried out. Advantageously, plasma reactors allowing high etch rates to be obtained may be used.

For this purpose, two types of RF sources, classed into two reactor categories, namely capacitively coupled (CCP) reactors and inductively coupled (ICP) reactors, and a chlorine-based gas, for example of $SiCl_4$ and $Cl_2$ chemistry or a mixture of $Cl_2$ and Ar, may notably be used Third Means for Removing an Array of Wires Using a Chemical Etching Process and a Nucleation Layer:

For example, for the growth of GaN-based wires on a silicon substrate, a TiN nucleation layer will be used.

After the wires intended to be preserved have been coated in a protective mask, selective chemical attack of the nucleation layer may be carried out with a solution, possibly a $H_2O_2/NH_4OH/H_2O$-based solution.

Fourth Means for Removing an Array of Wires Using a Mechanical Action to Break the Nanowires After the wires intended to be preserved have been coated in a protective mask, the carrier is placed in a medium subjected, for example, to ultrasound that will deliver a vibrational mechanical action and therefore break the uncoated, and therefore unprotected, wires.

The mechanical action may also be applied using a high-pressure jet of water or another fluid (inert gas, $CO_2$, etc.).

The mechanical action may even be applied using a solid tool, optionally a cutting or abrasive tool, to deform the wire beyond its breaking point or to wear the wire away.

Example Embodiment of a Process of the Invention in the Context of Fabrication of a Set of GaN-Wire-Based Chips FIGS. 7a to 7j schematically illustrate all of the various steps performed to obtain a device of the invention for a two-chip configuration.

Figure 1:
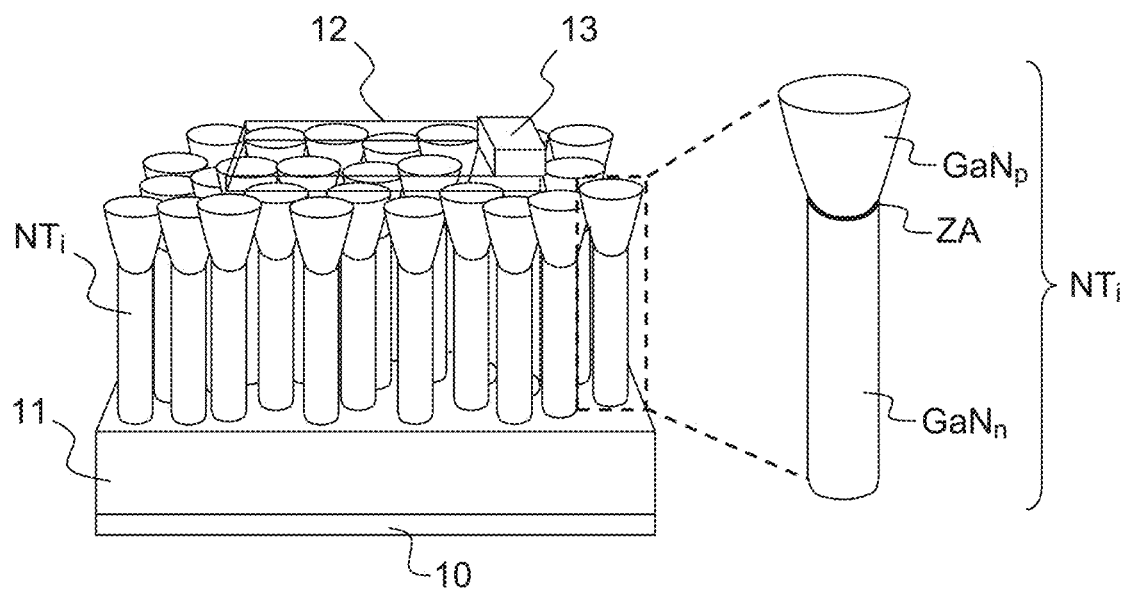
FIG. 1 illustrates a first example LED comprising wires according to the prior art.
Figure 2:
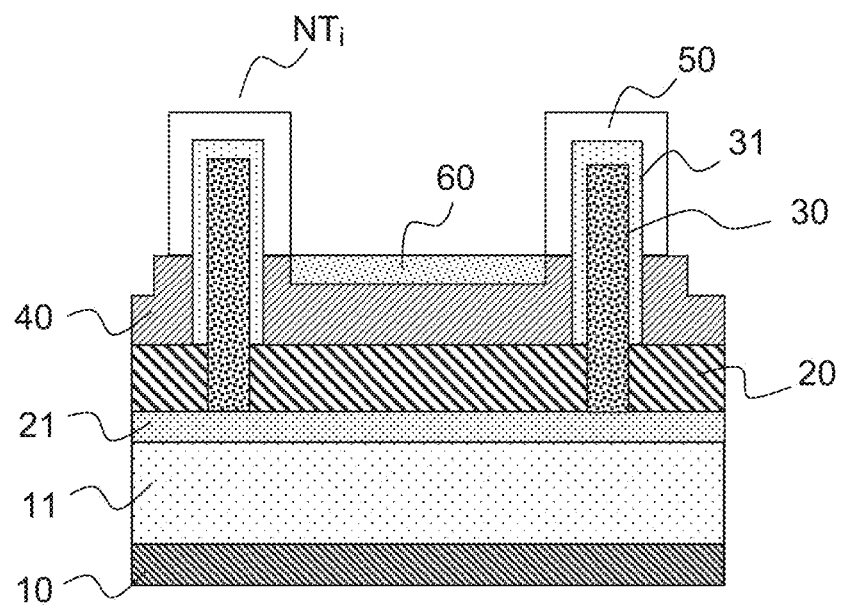
FIG. 2 illustrates a second example LED comprising wires according to the prior art.
Figure 3:
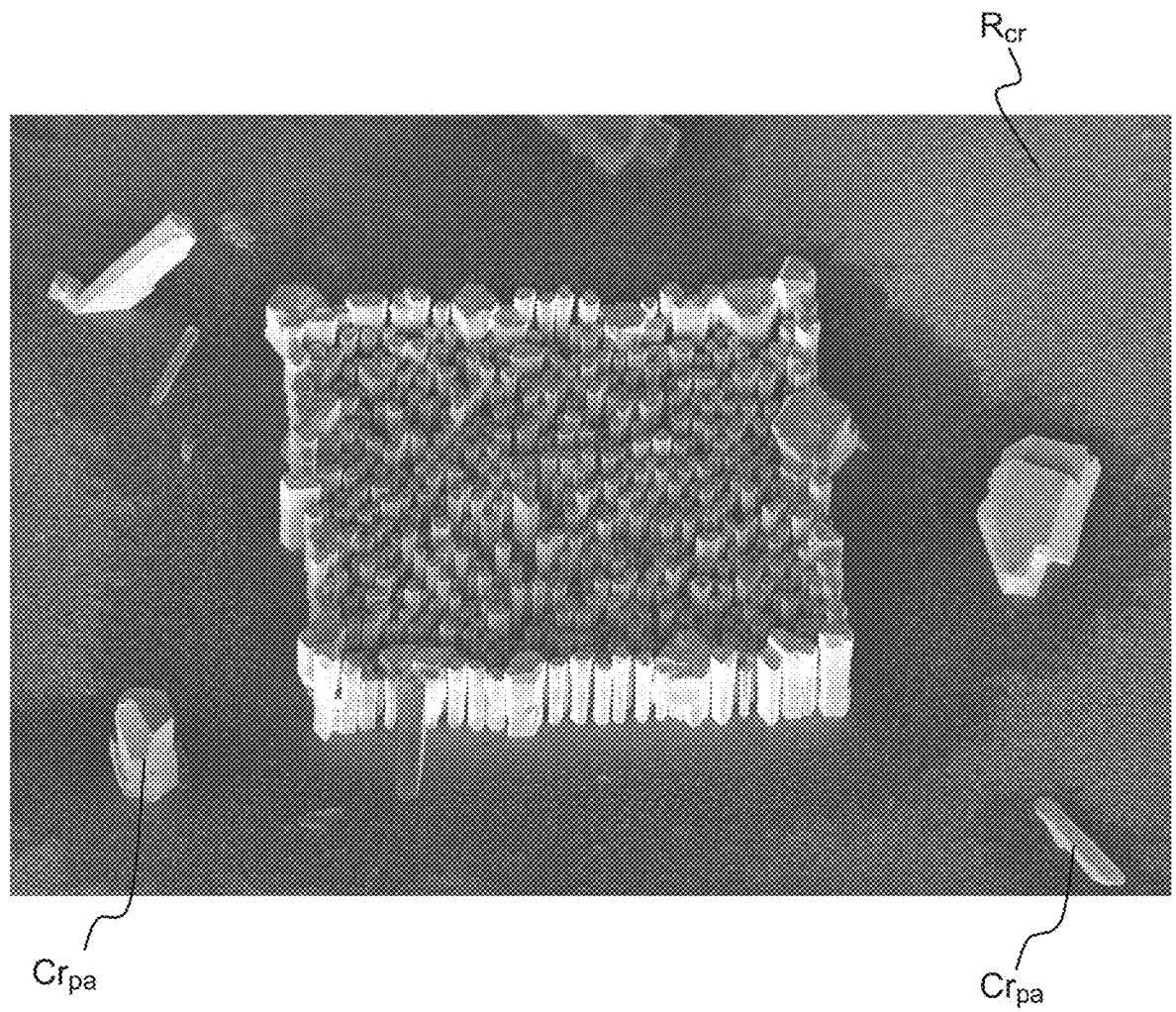
FIG. 3 illustrates a view of an array of wires separated by zones of non-growth in which defects are present in a prior-art configuration.

Step 1 Illustrated in FIG. 7a:

Wires are produced in a known way in a core/shell configuration such as illustrated in FIG. 2.

More precisely, on the surface of a substrate 100, covered with a nucleation layer 102, wires $NT_i$ are grown through apertures in a dielectric mask 200, the core of the nanowires 300 is typically made of n-doped GaN and intrinsically undoped GaN, the shell 301 being made of p-doped GaN. The apertures produced in the mask correspond to the individual growth zones zci of the wires. The substrate comprises a lower contact layer 101 on its back side.

Step 2 Illustrated in FIG. 7b:

Next, a protective photoresist 400 is deposited over all of the wires $NT_i$.

Step 3 Illustrated in FIG. 7c:

A conventional photolithography operation is used to remove the resist 400 level with the wires that are intended to be removed, in order to leave, on either side of these wires that are intended to be removed, an array of resist-coated wires $NT_{1i}$ and an array of resist-coated wires $NT_{2i}$.

Step 4 Illustrated in FIG. 7d:

The substrate locally covered with resist level with the two arrays of wires $NT_{1i}$ and $NT_{2i}$, is subjected to the action of ultrasound capable of causing the wires to break in the surface plane of the mask 200.

In this way, the two arrays of preserved wires $NT_{i1}$ and $NT_{i2}$ are obtained above individual growth zones $zc_{i1}$ and individual growth zones $zc_{i2}$, respectively, because they are protected by the protective resist layer, while leaving individual growth zones $zc_{i0}$ exposed results in wires not protected by the resist breaking, these locally removed wires leaving corresponding imprints.

After removal of the wires, these individual growth zones $zc_{i0}$ consist of the constituent material of the wires in the illustrated example.

In this way, an initial free area of width $d_{SL0}$ is left between two arrays of wires intended to belong to a first chip and a second chip, respectively, said area containing said imprints.

Step 5 Illustrated in FIG. 7e:

Next, all of the protective resist is removed, exposing the two arrays of wires $NT_{1i}$ and $NT_{2i}$.

Figure 7F:
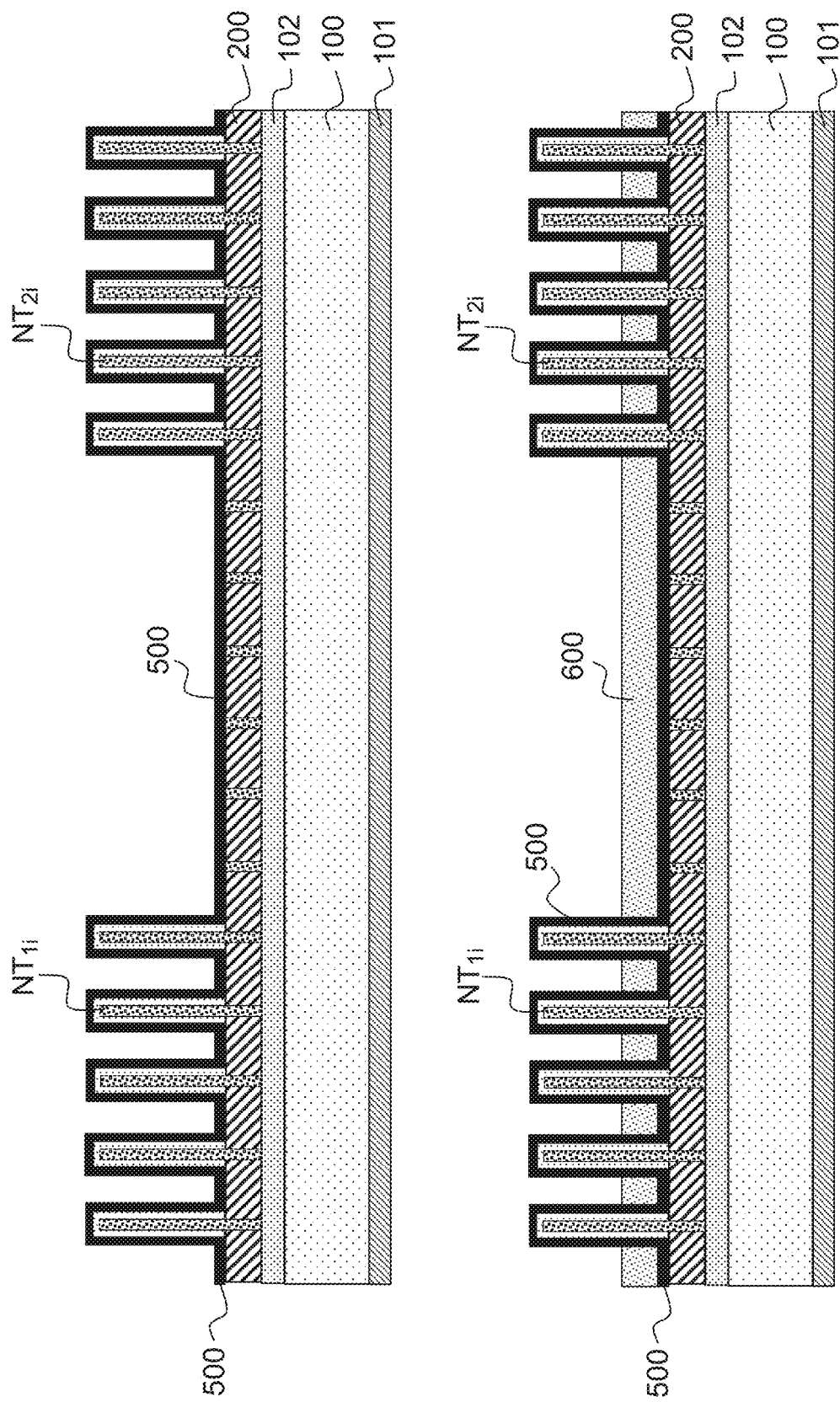

Step 6 Illustrated in FIG. 7f:

An etch mask intended for the p-type upper contact is then produced using a photoresist 600, which may be identical to the resist 400, after a dielectric layer 500 has been deposited.

Figure 7G:
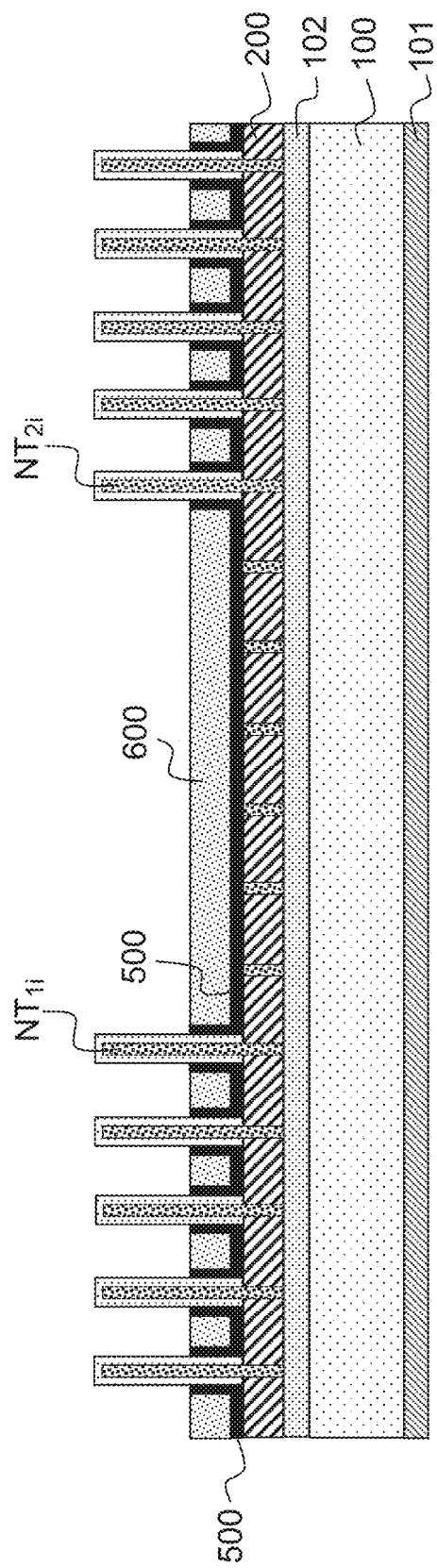

Step 7 Illustrated in FIG. 7g:

A partial etch of the dielectric layer 500 is then carried out through the masking layer 600.

Figure 7H:
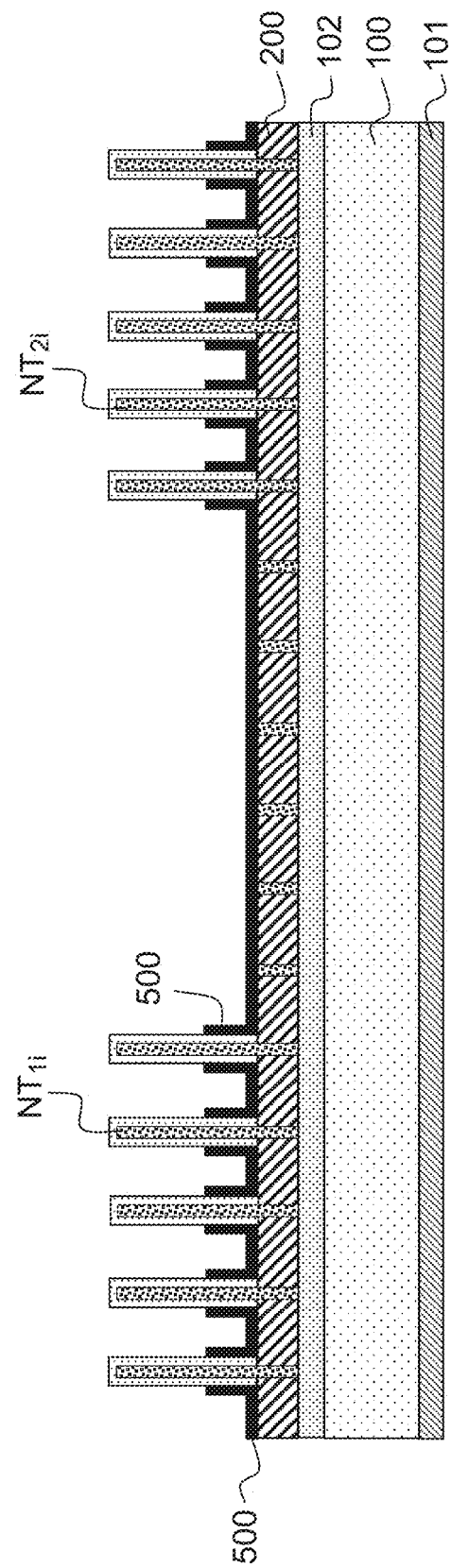

Step 8 Illustrated in FIG. 7h:

The resist layer 600 is then removed leaving the partially etched dielectric layer 500 exposed.

Step 9 Illustrated in FIG. 7i:

Next, a transparent conductive control layer 700, possibly and typically made of ITO (indium tin oxide) is deposited, allowing light emitted under the action of an electrical command to be transmitted.

Step 10 Illustrated in FIG. 7j:

Lastly, metal contacts 800 are deposited and etched between the wires, the two contacts not necessarily being located in the initial free area.

In summary, the following various advantages of the process for producing two adjacent chips based on LED wires implemented in the present invention, using uniform growth of wires over an area larger than the cumulative areas of the LED chips, then removal of a subset of wires in order to form an intermediate zone exempt from wires, and thus define adjacent chips, will be recalled:

edge effects are avoided during epitaxy of the wires, thereby obtaining a very high wire growth uniformity on the wafer scale;

parasitic growth of crystals, for example GaN crystals, between the technologically useful patterns is avoided;

a single process can be used for different epitaxial growth techniques, rather than multiple technique-dependent processes being required, thus enabling better control of the processes;

a single design with respect to pre-epitaxy technologies can be used, making organizing the logistics of fabrication easier; and personalization of the chips at the substrate level is delayed.

The invention claimed is:

1. A process for producing two adjacent chips each comprising an array of light-emitting wires connected together in a given chip by a transparent conductive layer, comprising the following steps:

producing, on a substrate, a plurality of individual zones for growing wires extending over an area greater than the cumulative area of said two adjacent chips;

growing wires (NTi) in the individual growth zones through apertures in a mask located on a surface of the substrate;

removing the wires from at least one individual growth zone forming an initial free area so as to define said arrays of light-emitting wires, said initial free area comprising imprints that are individual growth zones level with the removed wires; and then depositing the transparent conductive layer on each array of light-emitting wires so as to electrically connect together the light-emitting wires in the given chip, each transparent conductive layer being separated from the transparent conductive layer of the neighbouring chip by a free area, wherein the transparent conductive layer is also deposited so as to partially cover the at least one individual growth zone from which the wires have been removed, and wherein the individual growth zones are the apertures ($zci_a$, $zci$) defined in the mask located on the surface of said substrate.

2. The process for producing the two adjacent chips according to claim 1, in which the substrate comprises a nucleation layer on which said mask is located.

3. The process for producing the two adjacent chips according to claim 1, comprising producing electrical pads for electrically connecting said chips, said pads being placed on said corresponding transparent conductive layers.

4. The process for producing the two adjacent chips according to claim 1, in which the wire removal comprises the following steps:

producing a protective mask containing apertures level with the wires located on said initial free area of the substrate, said protective mask encapsulating at least a first array of wires and a second array of wires separated by said initial free area; and removing the wires in said initial free area.

5. The process for manufacturing the two adjacent chips according to claim 4, in which the wires are removed by a direct etching operation through said protective mask.

6. The process for manufacturing the two adjacent chips according to claim 5, in which the wires are removed by a direct chemical etching operation through said protective mask, or by a direct dry etching operation through said protective mask, with an RIE or ICP plasma.

7. The process for manufacturing the two adjacent chips according to claim 1, in which the wires are removed by a mechanical action causing said wires to break.

8. The process for manufacturing the two adjacent chips according to claim 7, in which the mechanical action is delivered by ultrasound, or by a high-pressure jet of fluid, or in the presence of a solid tool.

9. The process for manufacturing the two adjacent chips according to claim 1, in which the wires (NTi) are grown from a nucleation layer, the wire removal being carried out by attacking said nucleation layer chemically.

* * * * *